United States Patent
Luekeke et al.

(10) Patent No.: US 8,159,223 B2
(45) Date of Patent: Apr. 17, 2012

(54) RF COIL FOR USE IN AN MR IMAGING SYSTEM

(75) Inventors: Kai-michael Luekeke, Halstenbek (DE); Christoph Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 248 days.

(21) Appl. No.: 12/520,175

(22) PCT Filed: Dec. 18, 2007

(86) PCT No.: PCT/IB2007/055198
§ 371 (c)(1),
(2), (4) Date: Jun. 19, 2009

(87) PCT Pub. No.: WO2008/078284
PCT Pub. Date: Jul. 3, 2008

(65) Prior Publication Data
US 2010/0039111 A1 Feb. 18, 2010

(30) Foreign Application Priority Data
Dec. 22, 2006 (EP) .................................. 06126960

(51) Int. Cl.
*G01V 3/00* (2006.01)
(52) U.S. Cl. ........................ 324/318; 324/322
(58) Field of Classification Search .......... 324/300–322; 600/407–445, 587; 333/175
See application file for complete search history.

(56) References Cited

U.S. PATENT DOCUMENTS

| | | | | |
|---|---|---|---|---|
| 6,175,237 B1 * | 1/2001 | Doty et al. | | 324/318 |
| 6,633,161 B1 * | 10/2003 | Vaughan, Jr. | | 324/318 |
| 7,405,698 B2 * | 7/2008 | de Rochemont | | 343/700 MS |
| 7,446,929 B1 * | 11/2008 | Jayaraman et al. | | 359/299 |
| 7,515,330 B2 * | 4/2009 | Bratkovski | | 359/328 |
| 7,591,792 B2 * | 9/2009 | Bouton | | 600/587 |
| 7,719,281 B2 * | 5/2010 | Fontius et al. | | 324/322 |
| 7,911,386 B1 * | 3/2011 | Itoh et al. | | 343/700 MS |

(Continued)

FOREIGN PATENT DOCUMENTS

| | | |
|---|---|---|
| DE | 10124737 B4 | 2/2005 |
| DE | 102005013293 A1 | 10/2006 |
| GB | 2372102 A | 8/2002 |
| WO | 2006086778 A2 | 8/2006 |
| WO | 2006120588 A1 | 11/2006 |

OTHER PUBLICATIONS

Allard, M., et al.; Improved signal detection with metamaterial magnetic yokes; 2005; Proc. Intl. Soc. Mag. Reson. Med.; 13:871.

Sohn, J. R., et al.; Comparative Study on Various Artificial Magnetic Conductors for Low-Profile Antenna; 2006; Progress in Electromagnetics Research; PIER 61:27-37.

Ziolkowski, R. W.; Metamaterial-based Antennas: Research and Developments; 2006; IEICE Trans. Electron.; E89-C(9)1267-1275.

*Primary Examiner* — Brij Shrivastav

(57) ABSTRACT

An RF coil is proposed for use as an RF antenna for a MR imaging system, for transmitting RF excitation signals and for receiving MR relaxation signals. The RF coil of the invention includes an array of patches (1) which are capacitively coupled with each other. The array of patches forms a resonant surface on which surface currents can be resonantly excited for generating at least one field modus.

19 Claims, 10 Drawing Sheets

U.S. PATENT DOCUMENTS

| | | |
|---|---|---|
| 2002/0171589 A1 | 11/2002 | Nistler et al. |
| 2005/0134521 A1 | 6/2005 | Waltho |
| 2005/0174116 A1 | 8/2005 | Leussler et al. |
| 2006/0238197 A1* | 10/2006 | Vester .......................... 324/318 |
| 2009/0312595 A1* | 12/2009 | Leuthardt et al. ............... 600/27 |
| 2010/0188171 A1* | 7/2010 | Mohajer-Iravani et al. .. 333/175 |
| 2010/0283692 A1* | 11/2010 | Achour et al. ................ 343/702 |
| 2010/0308939 A1* | 12/2010 | Kurs .......................... 333/219.2 |

* cited by examiner

RF COIL FOR USE IN AN MR IMAGING SYSTEM

FIELD OF THE INVENTION

The invention relates to RF coils or RF antennas or RF antenna systems comprising one or more of RF coils or RF antennas, especially for use in an MR imaging system for transmitting RF excitation signals ($B_1$ field) and/or for receiving MR relaxation signals. The invention further relates to an MR imaging system comprising such an RF antenna system.

BACKGROUND OF THE INVENTION

RF/MR antennas for MR imaging systems are especially known in the form of RF/MR body coils which are fixedly mounted within an examination space of an MR imaging system for imaging a whole body to be examined, and in the form of RF/MR surface or local coils which are directly arranged on a local zone or area to be examined and which are constructed e.g. in the form of flexible pads or sleeves or cages like for example head coils.

US 2006/0238197 discloses a magnetic resonance system comprising a transmission antenna for exciting magnetic resonance signals in an examination subject arranged in an examination volume, a further RF source disposed relative to the examination volume and emitting an electrical field oscillating at the excitation frequency, and a barrier between the further RF source and the examination volume for shielding said examination volume from the electrical field generated by the further RF source. The barrier comprises a plurality of individual resonators that each inherently resonate at the excitation frequency, wherein each individual resonator comprises two capacitor surfaces, a first of it facing said RF source and a second of it facing the examination volume, wherein both capacitor surfaces are electrically connected to each other via a coil only.

SUMMARY OF THE INVENTION

Generally, it has revealed that especially body coils but as well other RF antennas are usually to be shielded or screened by means of an RF screen against the surrounding space and other outer components of an MR imaging system, like especially magnet systems for generating a basic magnetic field ($B_0$ field) and gradient magnet field coils for generating gradient magnet fields. By such a shielding, a detrimental interaction with these components, like especially a disturbance of the RF radiation by these components is avoided, a well defined RF environment for the related RF antenna is provided, and RF losses and undesirable RF excitations of spaces outside the maximum field of view (FOV) of the RF antenna are minimized.

Smaller RF/MR coils like head coils or even RF/MR surface loops usually also benefit from an RF screen because it reduces undesirable couplings to the RF/MR body coils and to regions external to the body to be examined.

At high field strengths (e.g. 7 T) an RF screen is even indispensible for a head coil to avoid excessive RF losses through radiation and coupling to the neck and shoulder region of a patient. For the latter purpose an additional ring-type RF shield in the neck-side opening as disclosed in WO 2006/120588 has proven to provide much improvement.

RF screens or shields are usually made from sheets or narrow meshes of good electrical conductors to provide a shielding surface coming as close as possible to a so-called "perfect electrical conductor" (PEC).

A considerable disadvantage of the shielding function of a metal screen on one side of an MR/RF antenna or coil structure is that the current sensitivity of the antenna or coil structure is drastically reduced by mirror currents which are caused by the RF screen and which have opposite directions relative to the primary currents of or in the RF antenna or coil structure.

More in detail, in the shielding metallic surfaces the currents are flowing in opposite direction to the primary currents in the leads of the RF coil structure, thus providing the desired shielding function outside the RF screen. However, they also considerably reduce the field generated by the RF coil structure in its field of view (FOV) in case of a transmit RF coil. Due to reciprocity the same reduction holds for the sensitivity of an RF/MR receive antenna or coil structure.

It is well known that for the simple scenario of an electrically conductive plane its effect can be exactly described by image currents at the same distance behind the screen which have opposite direction to the parallel primary currents of the antenna. For an (infinitely long) cylindrical screen the model of an equal amplitude but opposite direction image current at a radial position given by the original current's radial position "mirrored" at the screen radius ($R_{image} = R^2_{screen}/R_{original}$) has the same effect as the current distribution excited in the screen itself. As a consequence the RF magnetic field produced by a current carrying conductor of a transmit coil at some distance in the FOV is approximately proportional to the current magnitude and to the distance between the conductor and the screen.

These relationships usually impose considerable problems especially when designing an RF body coil because the maximum free access diameter of the RF body coil of an MR system has become one of the essential system parameters strongly influencing sales/market share, and accordingly it is desired to create designs using the minimum possible RF/MR coil to RF screen separation, i.e. to make the coil as a whole as thin as possible without reducing the $B_1$ (RF) field strength below established or required values although in view of the above relationships.

In the case of RF head coils the separation to the outer cylindrical screen is in most cases a minor design problem because usually outside the coil enough space is available, however, a thinner coil will usually have the advantage of less weight and, if the outer diameter would be kept the same and the inner diameter is widened, more comfort for a patient is obtained. More critical is the influence of a transversal ring-type shield in the neck-side opening, which due to its proximity to one end of the coil structure introduces asymmetry (more so in a birdcage type coil due to coupling with the near end-ring than in a coil made of TEM-elements).

For loop type RF coils with an RF screen, four reasons can be named in favor of a thin RF screen to loop design: light weight, low space consumption, less excess area required, reduced coupling to neighboring loops.

The common primary drawback of a close PEC (perfect electrical conductor) shield around head coils and loop type coils or other RF antenna is the reduced (current) sensitivity and, in detail, the more rapid decrease of the sensitivity as a function of the distance from the loop or other coil element. The latter can be understood by recognizing that the "primary" loop (i.e. the RF antenna) and the "mirror loop" with opposite current flow, effected by the PEC screen, form a first order RF-gradient coil in the RF transmit case or a first order gradiometer for magnetic flux coming from the FOV in the MR receive case. One might also say, a close PEC screen transforms a small loop from a magnetic dipol type sensor into a quadrupol sensor.

A secondary drawback of a close PEC screen is that it considerably reduces the impedance level of an RF/MR loop or other coil element or antenna which might make matching to amplifiers more difficult. (If 0<k<1 is the coupling coefficient to a single mirror loop, the impedance drops to (1−k)-times the free space value of the primary loop.)

Another aspect of these RF/MR antennas, especially of local loop-type coils is that usually half the sensitivity function of the antenna or coil is "wasted" because the examination object (like a patient), is positioned only on one side of the antenna, whereas on its opposite or "backside" which is directed away or off from the examination object, there is no useful "information" which could be received by the antenna.

One object underlying the invention is to provide an RF/MR antenna system or an RF/MR coil as mentioned in the introductory part above which has an improved effectiveness or sensitivity on one of its sides in comparison to those RF/MR antenna systems which are provided with a metal RF screen on the opposite side as mentioned above.

This object is solved by an RF coil for an MR imaging system, for transmitting RF excitation signals and/or for receiving MR relaxation signals, which is provided in combination with or which comprises a metamaterial which operates in the RF/MR frequency band like a magnetic conductor or a magnetic wall.

The subclaims disclose advantageous embodiments of invention.

Generally, it is proposed according to the invention to combine an RF/MR transmit/receive antenna or coil structure or coil for magnetic resonance imaging systems with a so-called metamaterial that let the RF screen of the antenna behave like a magnetic wall in the RF/MR frequency band of operation. The combination can especially be provided in the form of a replacement of a PEC screen by a metamaterial and/or in the form of a placement of a metamaterial in front of a PEC screen, and/or in another combination of a metamaterial with a PEC screen.

The metamaterial itself is usually a resonant periodic structure comprising dielectrics, wires and metal patches ("patch-array") positioned on a metallic groundplane (PEC) which structure is tuned such that it behaves as much as possible like a "perfect magnetic conductor" (PMC) at least in the RF/MR frequency band of operation.

The PMC is an abstraction (namely the dual of the PEC), which is used in "Theoretical Electromagnetics" to analyze problems with certain symmetry properties. It does not exist in the form of natural materials.

While at a PEC, the electrical field E is forced to be perpendicular and the magnetic field H is forced to be parallel to a PEC plane, the boundary conditions at a PMC plane are just the opposite, so that the electrical field E is forced to be parallel and the magnetic field H is forced to be perpendicular to a PMC plane.

In the present context the most interesting property is that the equivalent mirror currents "behind" a PMC screen have the same direction as the original currents (parallel to the screen surface); currents normal to the screen surface have equal sign for the PEC surface and opposite sign for the PMC surface.

Although PMC materials do not exist in the form of natural materials, combinations of well-known technical materials have been found and designed that mimic a PMC behavior at high frequencies in a limited bandwidth. Such metamaterials are described in the recent antenna literature for applications in the microwave range under the acronyms HIS (high impedance surface), AMC (artificial magnetic conductor), EBG (electromagnetic band gap material) and FSS (frequency selective surface).

A HIS, AMC or EBG is a magnetic conductor and does not conduct electric AC currents only in a certain (limited) frequency band (in contrary to a PMC which is a "perfect" magnetic conductor), and, correspondingly, the electrical field E is forced to be parallel and the magnetic field H is forced to be perpendicular to a HIS-, AMC- or EBG-plane only in a limited frequency band as well. However, if this frequency band is the RF/MR frequency band, the RF/MR image currents of the RF/MR primary (antenna) currents appear to be in-phase when using such a HIS-, AMC- or EBG-plane (rather than out-of-phase in case of a PEC screen), aiding the RF field generation by the primary antenna or structure. Furthermore, propagating surface waves are not supported, reducing unwanted coupling to neighboring structures and reducing unwanted radiation from the screen edges.

According to the invention, it is proposed to combine RF/MR antennas or coils with especially AMC metamaterials that are designed for operation at the typical RF/MR-frequencies.

An RF screen built in the form of such an AMC metamaterial combines the properties of a normal metal screen (approximately a PEC screen) towards the "outside world" of the coil, and of approximately a PEC screen towards the coil, at least in the RF/MR operational frequency band. At frequencies outside its own AMC-bandwidth the behavior of the screen on the coil side approaches approximately a PEC-type screen.

The metamaterial itself is a tuned resonant surface, which leads to novel MR coil properties. RF/MR coils making use of especially AMC metamaterials instead of conventional RF screens can be thinner or shorter without sacrificing current sensitivity, or they can achieve higher current sensitivity with conventional dimensions.

Novel thin RF/MR antennas or coils can be provided using accordingly excited AMC metamaterials themselves instead of present coil structures.

When the resonant frequency of the metamaterial is made controllable, for example by switching on and off one or more of the capacitors which are connected between patches of the metamaterial, this leads to novel RF/MR antennas or coils which can be controlled with respect to their coupling or decoupling, their impedance and other properties.

Combinations of AMC- and "metal screen"-backed coil elements allow to achieve lateral current sensitivity profiling within a low geometric coil profile.

Besides improving coil properties, it can be advantageous to at least partially cover metal surfaces of the MR imaging system exposed to the RF-field with AMC materials, in order to flip the dual boundary conditions for the E-field (parallel to AMC) and H-field (perpendicular to AMC), corresponding to a change from an electrical to a magnetic conductor surface, which can lead to an improvement of the spatial $B_1$-field quality.

In the case of RF screens with undesirable retro-action on the coil properties like e.g. a transversal ring shield at the neck-side end of a head coil, a partial covering of the PEC screen with a PMC might be employed to minimize this effect.

Consequently, substantial beneficial advantages are in terms of RF transmit antennas or coils that the mirror currents enhance the effect of the original currents instead of reducing them as mentioned above. This effect is the bigger, the closer the PMC screen is to the primary current carrying conductors.

Substantial beneficial advantages are in terms of MR receive antennas or coils that no gradiometer (quadrupol) effect is observed. The so far not utilized sensitivity of the "backside" of the loop coil as mentioned above is "reflected" with positive sign to the FOV side, leading to up to twice of the sensitivity (in the ideal limit), i.e. not twice of the SNR, but twice of the current or voltage sensitivity.

The impedance level of an RF/MR antenna or coil can be made up to twice of that of the same antenna or coil in free space ((1+k)-times), which can make matching to pre-amplifiers easier and such, after all, improve the SNR of the antenna or coil.

Finally, a new planar resonant patch array RF/MR antenna or coil is provided, which is capable of a three-axis control of the $B_1$ field, including a circular polarization, and which can have three orthogonal fundamental resonance modes. These modes can be tuned to the same RF frequency. Excitation of these modes by a related current distribution on the patch array allows to control the RF excitation field ($B_1$ field) in three axis. This includes the generation of circular polarization with a choosable normal direction.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention which are given with reference to the drawings.

DETAILED DESCRIPTION OF EMBODIMENTS

In the following, some exemplary combinations of basic coil elements with at least partial AMC groundplanes are given. These quantitative examples show the improved properties of combinations of typical MR coil elements with AMC-type structures.

An "Electromagnetic Field Calculation"-program has been used to simulate and analyze the current density distributions on these examples and the current sensitivity of a metal strip conductor bridge above a groundplane (like the ubiquitous "TEM"-element) and that of a square loop. In the FIGS. 2, 4, 11, 12, 14, 15 and 18 to 21 which show the calculated current density distributions, the degree of density is indicated in the form of the degree of darkness, so that the more dense the currents are, the darker the related region is indicated and vice versa.

Figure 1:
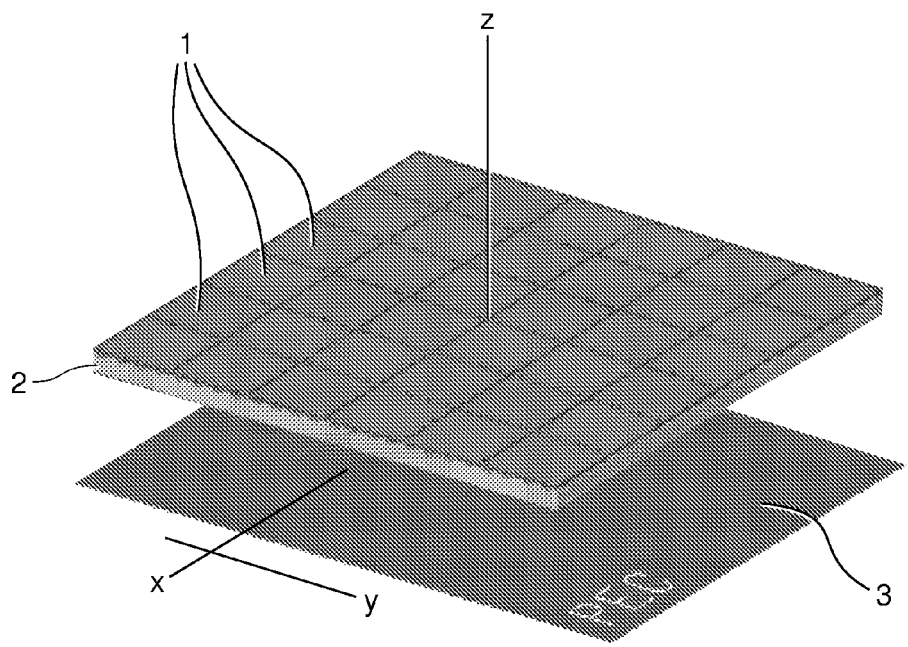
FIG. 1 shows a schematic view of an AMC structure which is implemented in the form of a patch array structure above a PEC ground plane.

The AMC metamaterial has been implemented as shown in FIG. 1 in the form of a patch array structure with square patches 1 with a patch size of 4×4 cm on one side of a substrate 2 in the form of an "air"-substrate (i.e. $\in_r=1$) which is delimited on its opposite side by a PEC ground plane 3. The whole structure has a height of 1 cm. Alternatively to the plane surface, the array of patches 1 can also form a curved surface.

The gaps between the patches 1 are defined for the simulation by means of the calculation program as infinitely narrow and filled with an edge-capacitance that makes the structure resonant at approximately 128 MHz. In a practical realization, the gaps and edge-capacitance (which are e.g. switchable for controlling the resonance frequency of the structure) are selected together with the patch size to obtain the desired resonance frequency.

Figure 2:
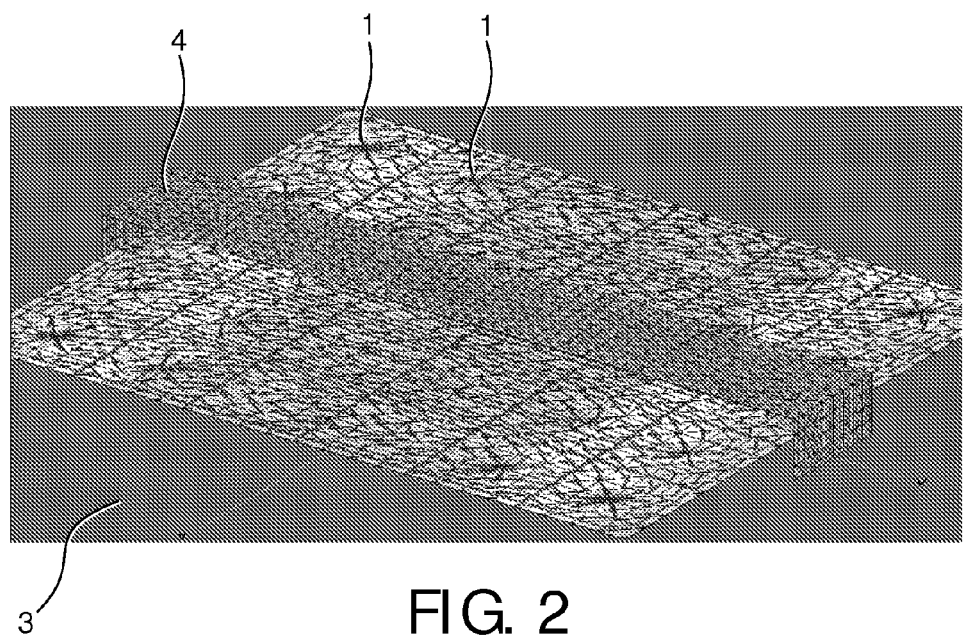
FIG. 2 shows a schematic view of a surface current density distribution on a patch array structure according to a first embodiment of the invention.

FIG. 2 shows a surface current density distribution of the AMC structure according to FIG. 1. A primary strip 4 of this structure as shown in FIG. 2 is 25 cm long, 4 cm wide and positioned 2.5 cm above the PEC groundplane 3. This AMC consists of 6 by 5 patches 1 symmetrically positioned below and only within the area which bridged by the strip 4. The strip 4 is fed anti-symmetrically from its ends standing on the PEC ground 3. Generally, the patch-array can be excited as well by connecting it directly with a supply line for feeding the current at one or more positions at the patch array instead of by means of the primary strip 4 (42).

Figure 3:
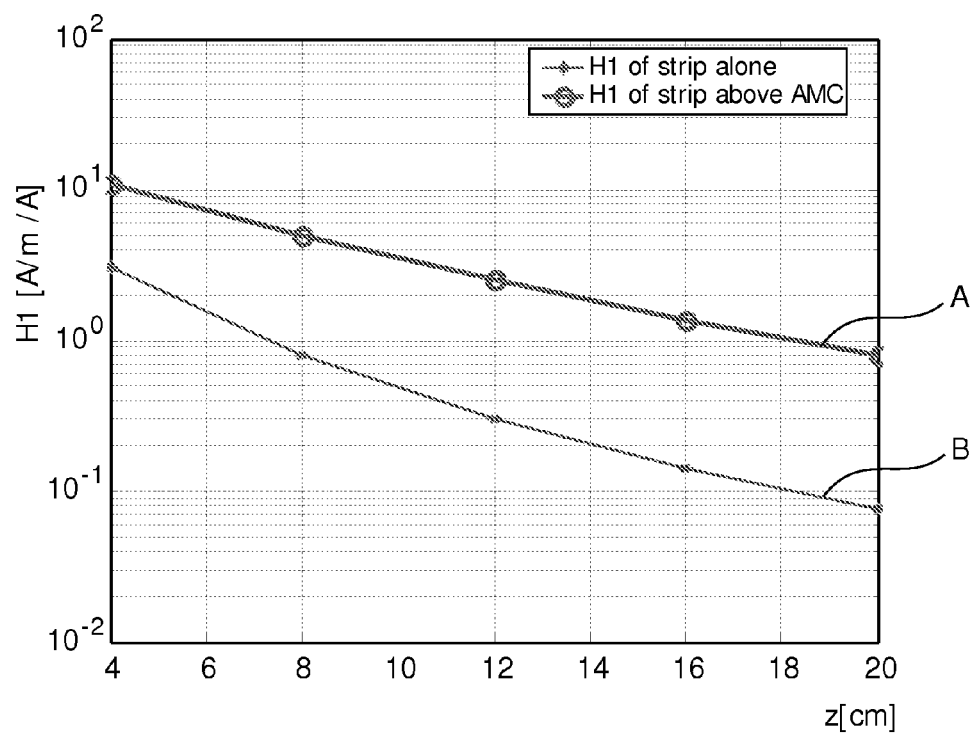
FIG. 3 shows a graph of the magnetic field strength over a normal distance to ground of the structure according to FIG. 2.

FIG. 3 shows in graph A the magnetic field H1 of the AMC structure according to FIG. 2 above the center of the strip 4 versus distance, normalized to the current through the center. Close to the strip 4 at z=4 cm there is more than a three-fold increase of the field strength H1 compared to the field strength H1 (graph B) of the strip 4 above PEC ground 3 alone, i.e. without the patch array.

Further away at z=20 cm the AMC-backed strip 4 has approximately ten-fold sensitivity in comparison to the strip 4 above PEC ground 3 alone. This is due to the less steep decrease of sensitivity with distance of the AMC structure, as discussed above.

Figure 4:
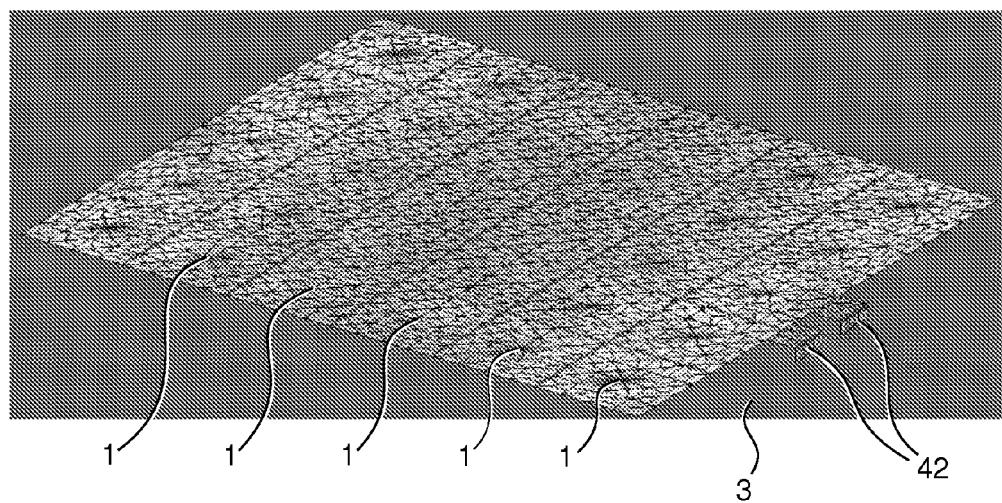
FIG. 4 shows a schematic view of a surface current density distribution on a patch array structure according to a second embodiment of the invention.

FIG. 4 shows a surface current density distribution of the AMC structure according to FIG. 2, however, in which the primary strip is put at half height between the upper AMC surface (patches 1) and the PEC ground 3 and split into two parallel strips 42 (because of the central patch posts). This AMC structure has a height of only 1 cm. Similar The results which are obtained with the structure are very similar to the structure according to FIG. 2.

It is also possible to excite the patch array without the use of strips 4; 42 directly via the corner posts, but this mode of operation does not have a "classical" MR-coil counterpart to compare with.

Figure 5:
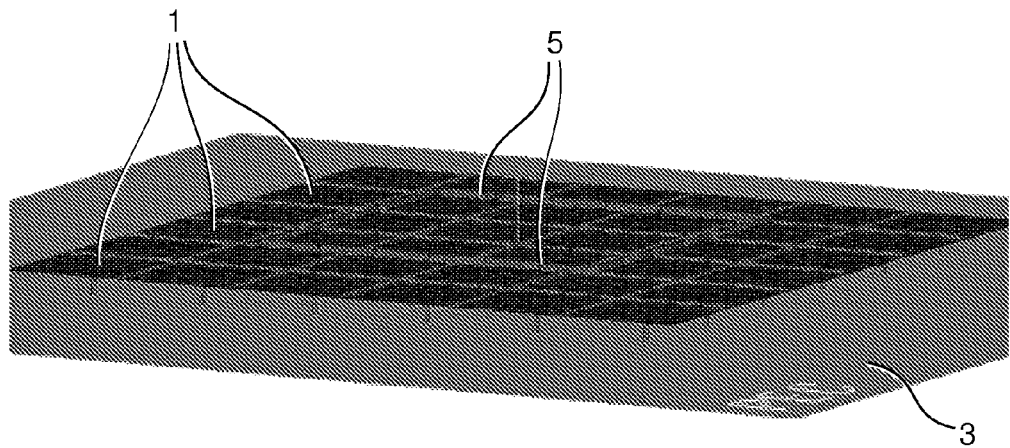
FIG. 5 shows a schematic first view of a patch array structure according to a third embodiment of the invention.
Figure 6:
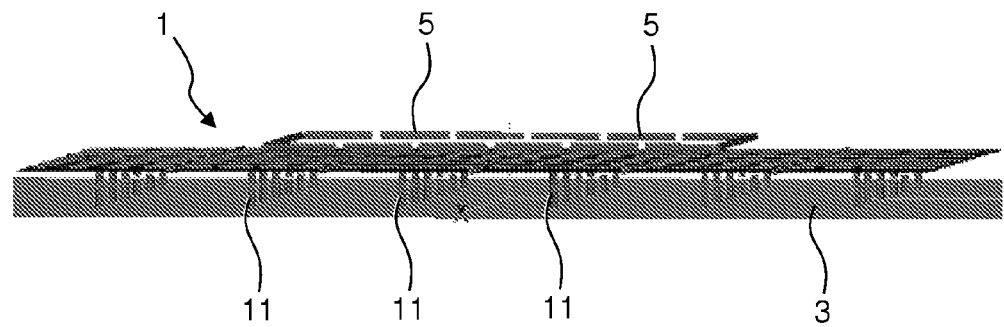
FIG. 6 shows a schematic second view of the patch array structure according to FIG. 5.

Then the sensitivity of an AMC structure with a square loop coil 5 according to FIGS. 5 and 6 (instead of the stripes 4; 42) with 12 cm edge length has been analyzed for heights of 25 mm and 15 mm above the PEC ground 3. The AMC model comprises 6 by 6 patches 1 as described above, resulting in 24 by 24 cm side length of the whole structure. The loop coil 5 was 15 mm above PEC ground 3, or 5 mm above the finite AMC structure with 10 mm height above the PEC ground 3.

FIG. 6 as well shows the grounding posts 11 (which are not indicated in FIGS. 2 and 4), each extending centrally between a patch 1 and the PEC ground 3. However, instead of these posts 11, metal strips could be provided to form a ground return path.

Figure 7:
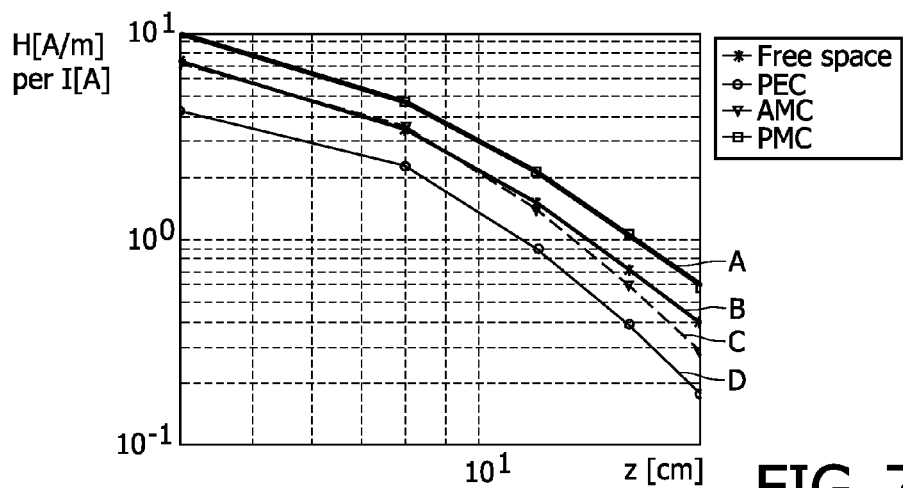
FIG. 7 shows graphs of the magnetic field strength over a normal distance to ground of the structure according to FIG. 5 for different types of ground planes for a first positioning of a current loop.

FIG. 7 shows the magnetic field H above the center of the loop coil 5, normalized to 1 Ampere loop current, versus distance z to the PEC groundplane 3 for different types of groundplanes, namely for PMC (graph A), for PEC (graph D), for the above AMC-model (graph C) and for free space, i.e. no groundplane (graph B).

Between 4-12 cm distance use of the finite size AMC almost re-establishes the free space sensitivity of the coil. The ideal infinite size PMC (graph A) would even raise the sensitivity by a factor of about 1.4-1.54 over the free space value.

Figure 8:
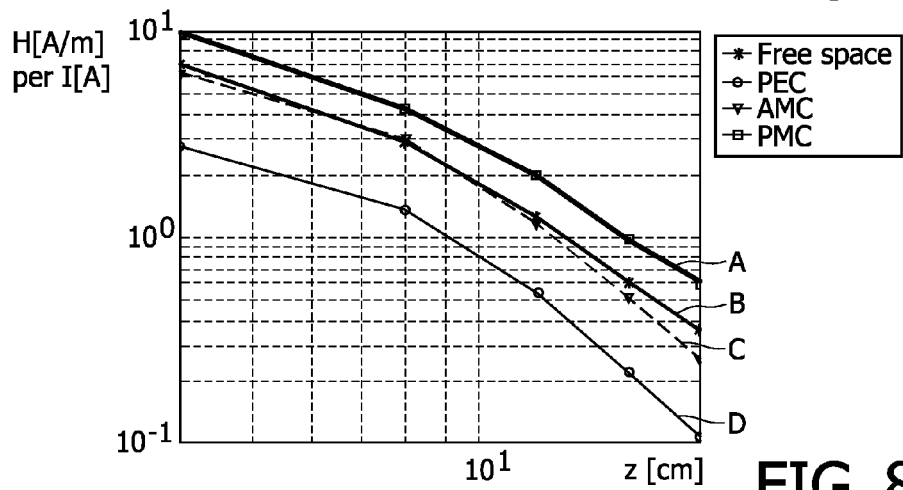
FIG. 8 shows graphs of the magnetic field strength over a normal distance to ground of the structure according to FIG. 5 for different types of ground planes for a second positioning of the current loop.

FIG. 8 shows these graphs for the corresponding results for the same loop coil 5 which is positioned 15 mm above ground 3, i.e. 5 mm above the AMC surface. Here the ideal PMC (graph A) would raise the sensitivity by a factor of about 1.56-1.69 over the free space value (graph B).

Figure 9:
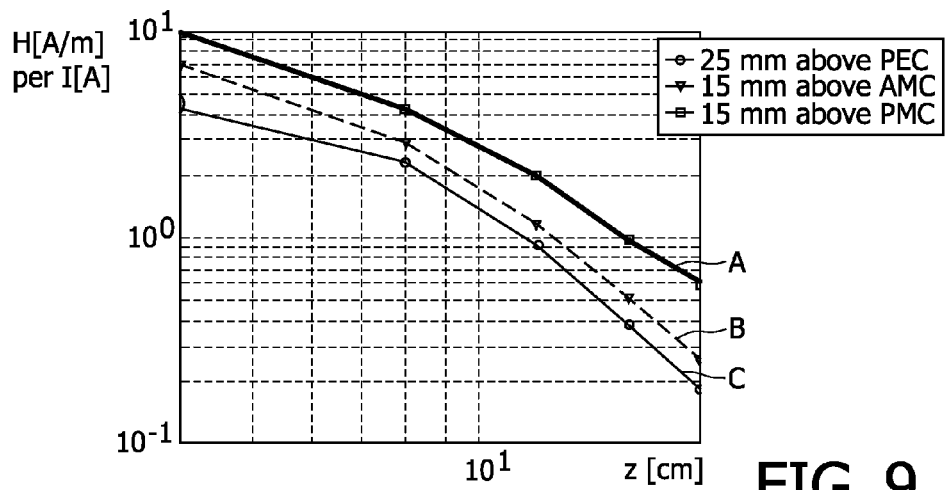
FIG. 9 shows graphs for comparing the sensitivities of the patch array structure according to FIG. 5 over a normal distance to ground for different positionings of the current loops.

FIG. 9 compares the sensitivity of the loop coil 5 which is positioned 25 mm above a PEC ground 3 (graph C) with the same loop coil 5 which is positioned 15 mm above ground 3 with the finite size AMC-model (graph B). Although 10 mm thinner, the latter coil has even higher sensitivity. Graph A again shows the sensitivity of the loop coil 5 which is positioned 15 mm above an ideal infinite size PMC ground.

If the AMC structure of a receive coil has to be de-tuned or de-activated during the transmit phase of an MR measurement sequence, this can e.g. be done by shorting the capacitive elements between adjacent units (in FIG. 1 the gaps between the patches 1) by suitable active (e.g. controlled PIN-diodes) or passive (e.g. anti-parallel diode pairs) switches, as practiced in present un-screened loop coils.

The preferred application of these coils are especially thin body coils, bore-tube integrated loop coils, thin screened head coils and flat screened loop coils.

Furthermore, a new planar resonant patch array MR/RF coil, which is capable of three-axis $B_1$ control including circular polarization is provided by the invention. It can be realized by the above structures which can have three orthogonal fundamental resonance modes. These modes can be tuned to the same RF frequency. Excitation of these modes by means of currents allows to control the RF excitation field ($B_1$ field) in three axis. This includes the generation of circular polarization with a choosable normal direction.

Figure 10:
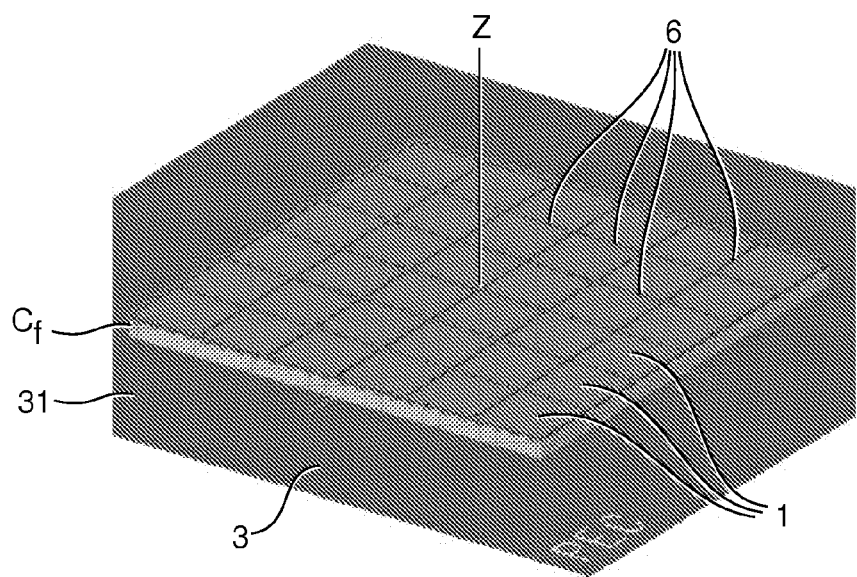
FIG. 10 shows a schematic view of a first model of a planar resonant patch array antenna with square unit elements as implemented in an electromagnetic field computation program.

A design example according to FIG. 10 comprises a patch-array of 6 by 6 metal plates or patches 1, each of 4 by 4 cm size, placed 1 cm above a metallic ground plane (PEC) 3. Adjacent patch edges are connected by an edge capacitor. The patch edges at the outer fringes of the array are connected with a fringe capacitor $C_f$ to a vertical circumferential metal strip 31 making the connection to the ground plane 3. Two fundamental modes are substantially diagonal current patterns across the patch-array as e.g. excited by a diagonal line current near the surface. For patch-array shapes invariant under 90 degree rotation around the normal direction (e.g. squares or cycles) these modes produce orthogonal tangential fields above the center. All linear combinations of these two modes also have the same resonance frequency. The third mode is a ring type mode which can e.g. be excited by a square current loop near the array surface. By accordingly selecting the capacitor values at the inner and the outer edges of the patch-array, the resonance frequency for the ring type mode can be made equal to that of the diagonal modes. This mode produces a vertical magnetic field above the array center. By the excitation of all three modes the RF excitation field ($B_1$ field) above the patch-array can be controlled in three axes.

FIG. 10 shows a sketch of a model as implemented in an Electromagnetic Field Computation Program. The dotted lines 6 between the patches 1 indicate the location of the edge capacitors between the patches 1.

The resonance frequencies and current patterns in the surface of the patch-array have been calculated for different capacitor choices. For a design example values have been chosen to make the coil structure resonant near the 3 Tesla Larmor frequency of about 128 MHz.

Figure 11:
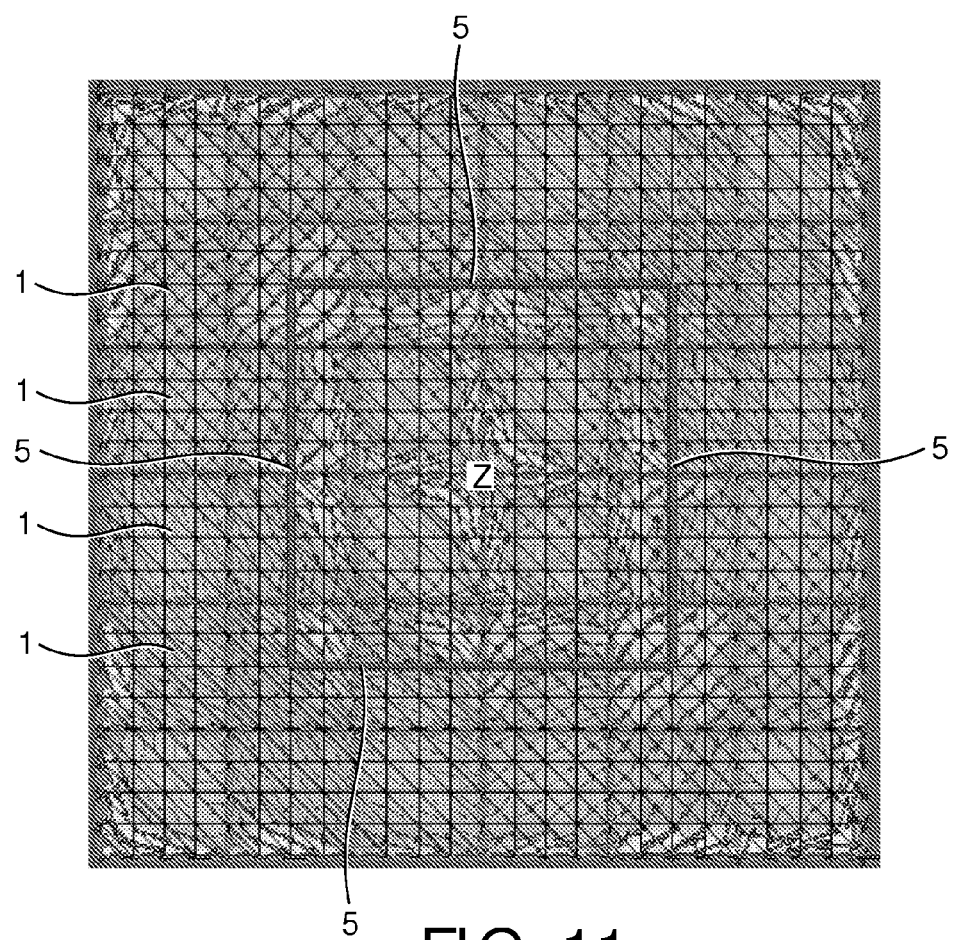
FIG. 11 shows a schematic view of a surface current density distribution on the antenna according to FIG. 10 with a loop excitation.

FIG. 11 shows the current pattern for excitation with a square current loop 5. The current in the loop 5 flows counter clockwise. As the grey arrows in the patch array's surface indicate, the same is predominantly true for the excited surface currents. With $C_{edge}$=169.885 pF and $C_{fringe}$=260 pF this mode resonates at $f_{loop}$=125.977 MHz.

Figure 12:
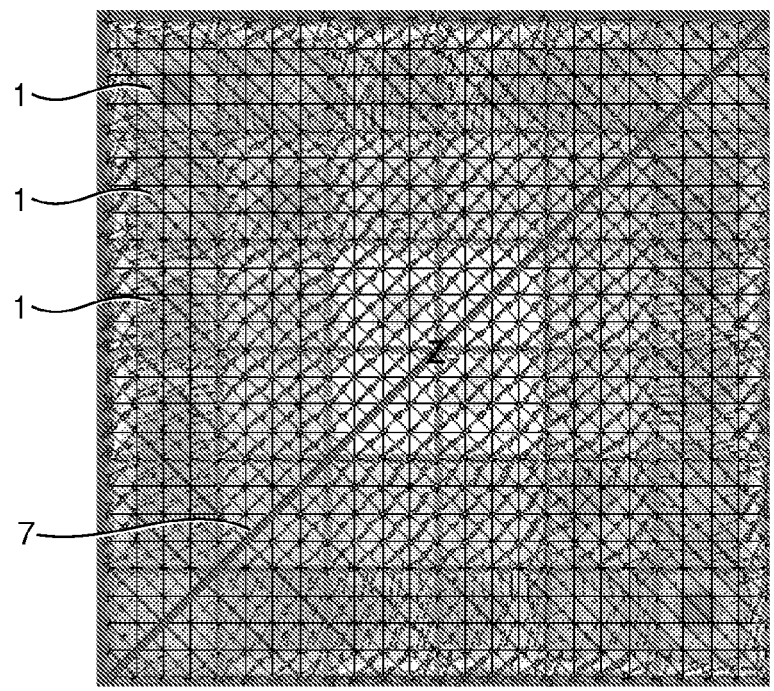
FIG. 12 shows a schematic view of a surface current density distribution on the antenna according to FIG. 10 with a linear excitation.

FIG. 12 shows the current pattern for excitation with a diagonal line current 7 above the array of patches 1. The excitation current flows from the lower left corner to the upper right corner as do the excited surface currents. With the above specified capacitor choice this mode resonates at $f_{diag}$=116.18 MHz.

Figure 13:
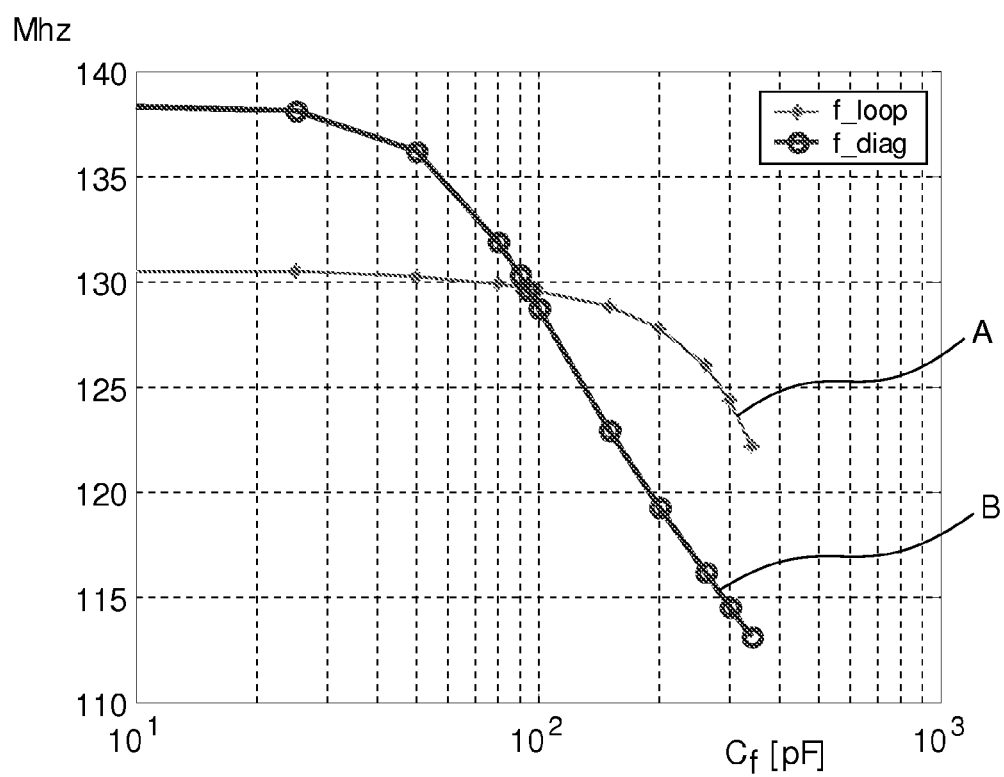
FIG. 13 shows a graph of the resonance frequencies for the antennas according to FIGS. 11 and 12 for different fringe capacitances.

FIG. 13 shows in graph A the resonance frequency $f_{loop}$ over the fringe capacitance $C_f$ (=$C_{fringe}$) of the structure according to FIG. 11, and in graph B the resonance frequency $f_{diag}$ over the fringe capacitance $C_f$ of the structure according to FIG. 12. It can be seen how the two resonance frequencies change when the fringe capacitance $C_f$ is varied between 10 pF and 340 pF. At $C_f$=94.3 pF the resonance frequencies are approximately equal:
$f_{loop}$=129.639 MHz, $f_{diag}$=129.617 MHz.

Figure 14:
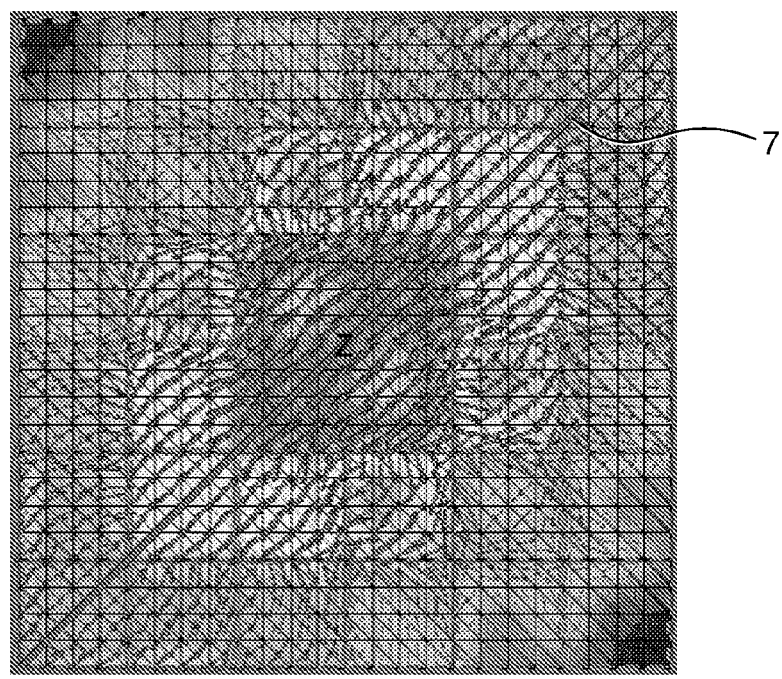
FIG. 14 shows a schematic view of a surface current density distribution on the antenna according to FIG. 10 with a linear excitation and tuned by means of a fringe capacitance for equal resonance frequencies at loop and diagonal mode.
Figure 15:
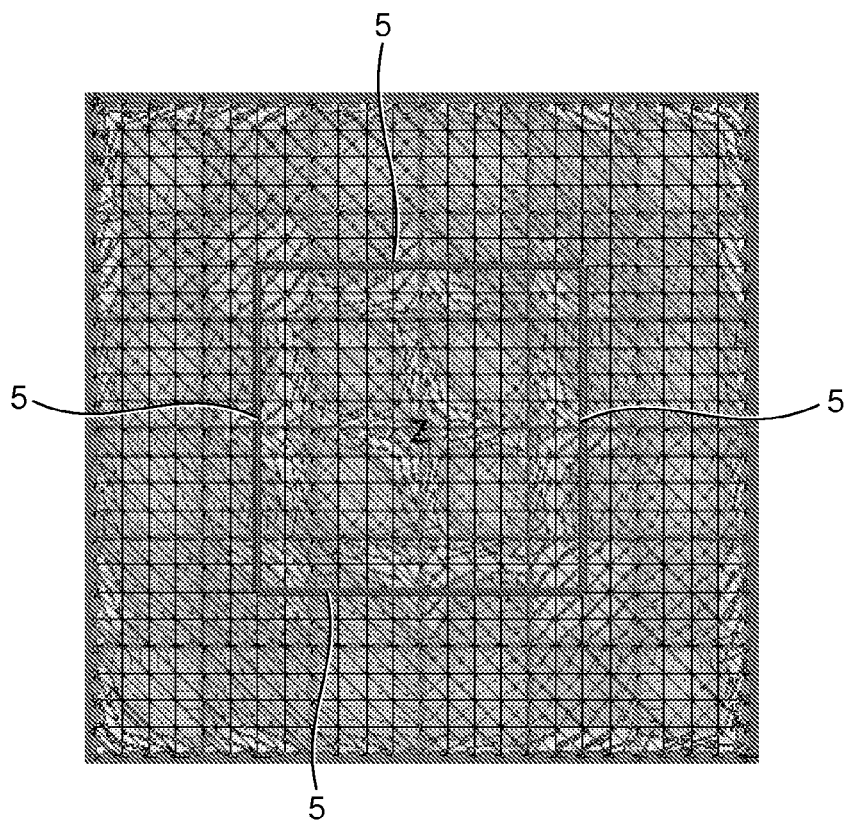
FIG. 15 shows a schematic view of a surface current density distribution on the antenna according to FIG. 10 with a loop excitation and tuned by means of a fringe capacitance for equal resonance frequencies at loop and diagonal mode.

FIGS. 14 and 15 show the surface current patterns for the diagonal line current 7 (FIG. 14) and for the loop current 5 (FIG. 15) for this special tuning. The current patterns have changed in some detail, but the principle mode properties are maintained. The resonance frequency for excitation along the other diagonal of FIG. 14 must be the same for symmetry reasons.

Figure 16:
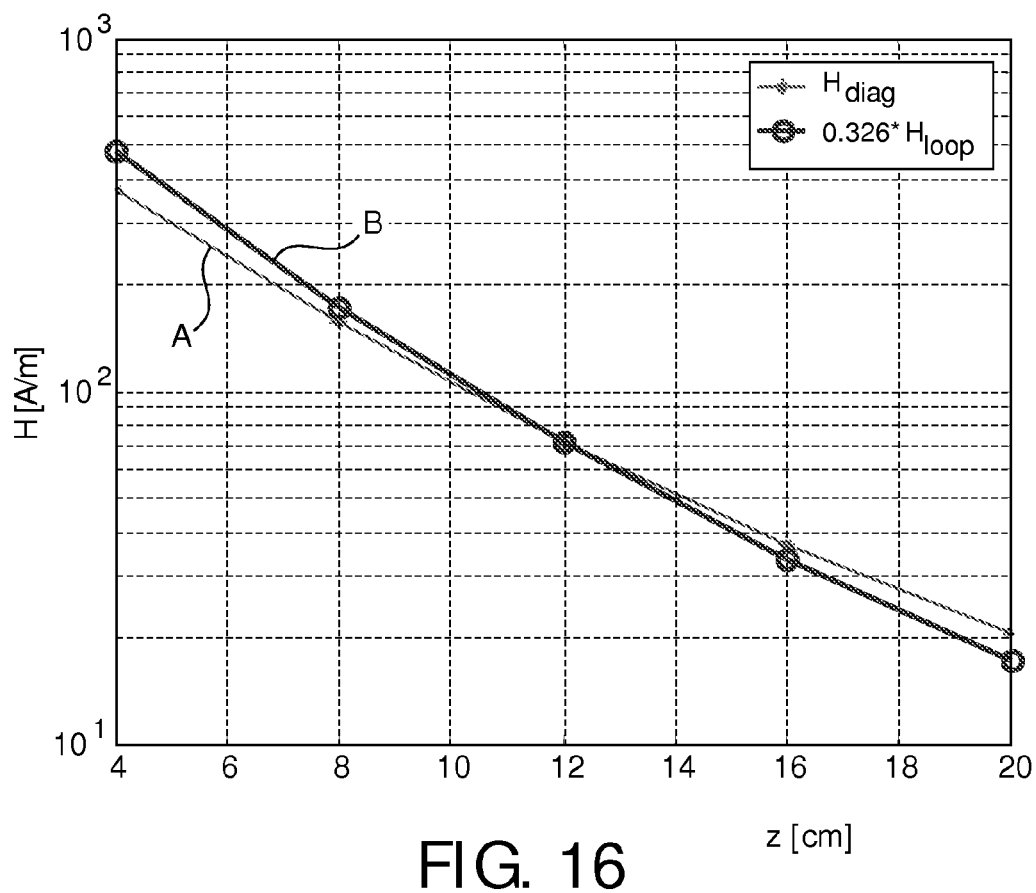
FIG. 16 shows a graph of the relative decrease of the magnetic field magnitude versus the height above the ground plane for diagonal and loop excitation.

FIG. 16 shows the relative decrease of the magnetic field magnitude H versus the height z above groundplane at x=y=0 for diagonal (Hdiag) (graph A) and loop (Hloop) (graph B) excitation at z=1.5 cm height. The slopes are not exactly the same but similar.

The circumferential metal plates and capacitors can be omitted, when it is not required that the ring-type mode has the same frequency as the diagonal modes and when it is allowed that the diagonal modes turn into butterfly-type (figure of "8") modes.

As the tuning curves indicate, it is also possible to tune either the loop-type mode or the diagonal-type modes to the Fluorine frequency (94% lower) and keep the other at the Proton frequency.

Figure 17:
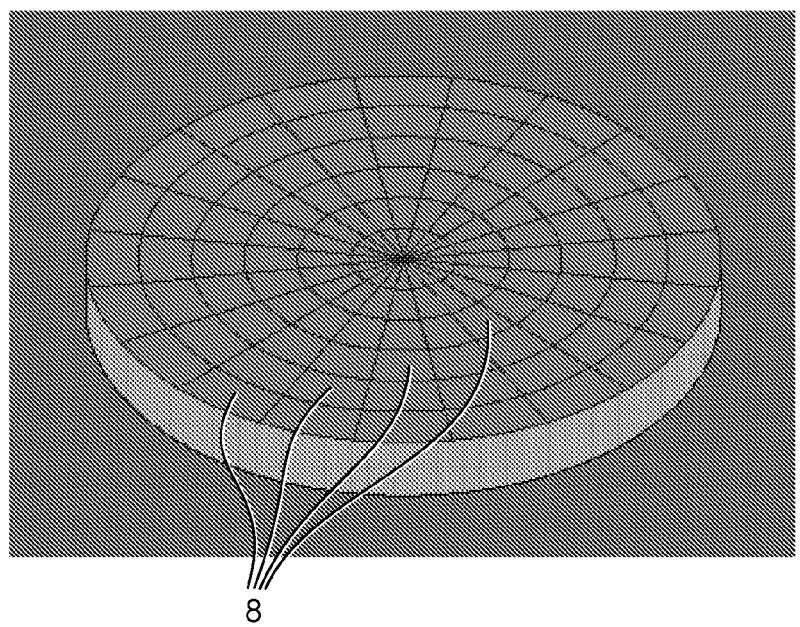
FIG. 17 shows a schematic view of a second model of a planar resonant patch array antenna with circular ring sector unit elements as implemented in an electromagnetic field computation program.

Instead of the square array with square unit patch elements the coil might also be constructed with circular shape consisting of circular ring sector patch elements 8 according to FIG. 17.

Also, to gain more degrees of freedom for the shaping of the current patterns of the fundamental modes, more than just two capacitor values may be considered within the symmetry constraints required for the intended 2D (quadrature) transversal modes. E.g. all segments of a radial edge might be allowed to have individual C-values as well as all circular edge segments of same radius.

Also, different from this FIG. 17, the individual circular rings might have different radial extensions. These parameters may be used to optimize the current patterns of the utilized resonance modes.

Figure 18:
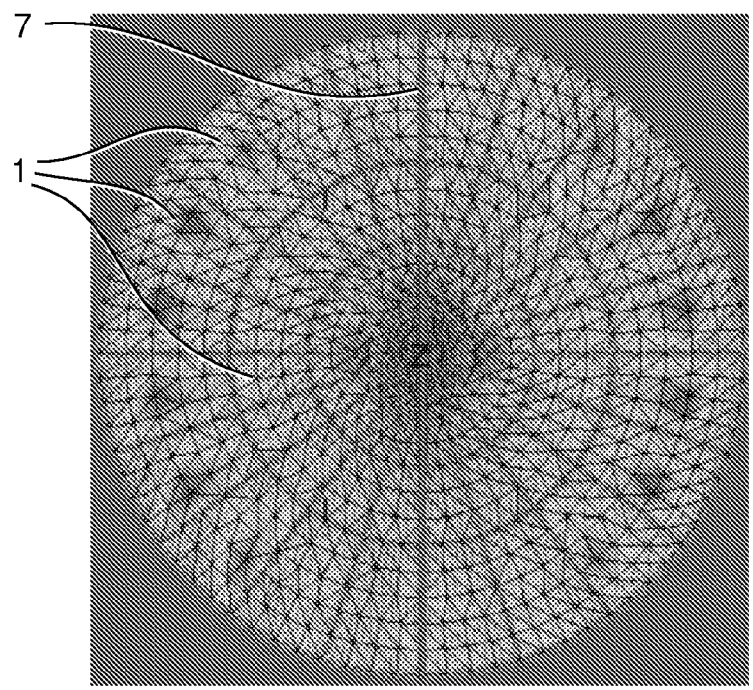
FIG. 18 shows a schematic view of a surface current density distribution on the antenna according to FIG. 17 on a PEC ground, with a linear excitation.
Figure 19:
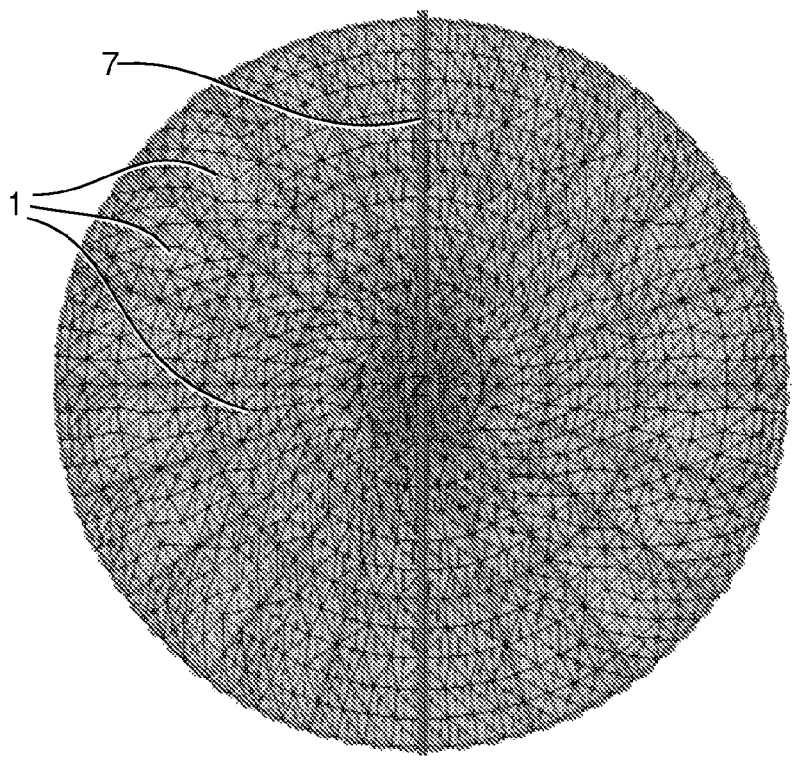
FIG. 19 shows a schematic view of a surface current density distribution on the antenna according to FIG. 17 on a circular bottom plate, with a linear excitation.
Figure 20:
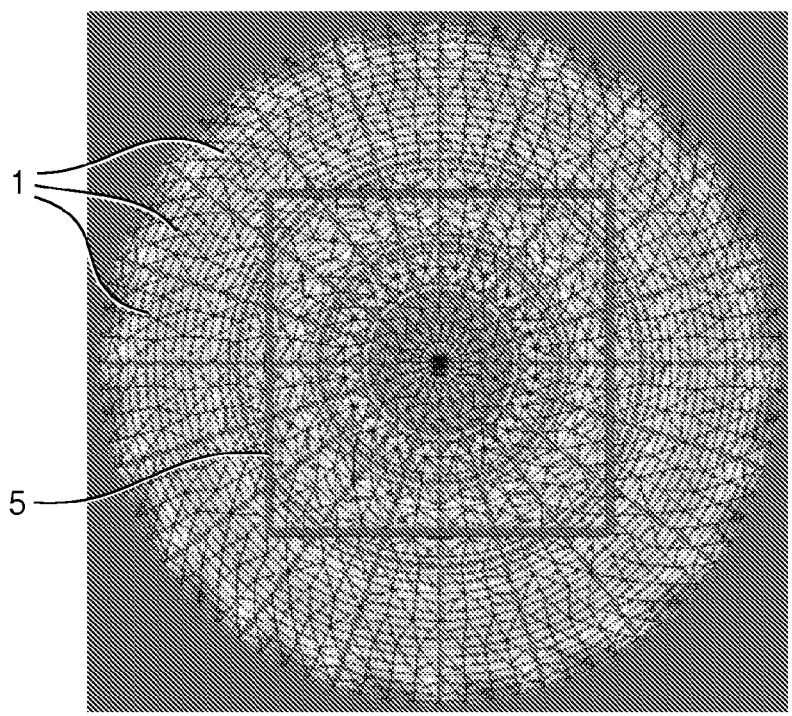
FIG. 20 shows a schematic view of a surface current density distribution on the antenna according to FIG. 17 on a PEC ground, with a loop excitation.
Figure 21:
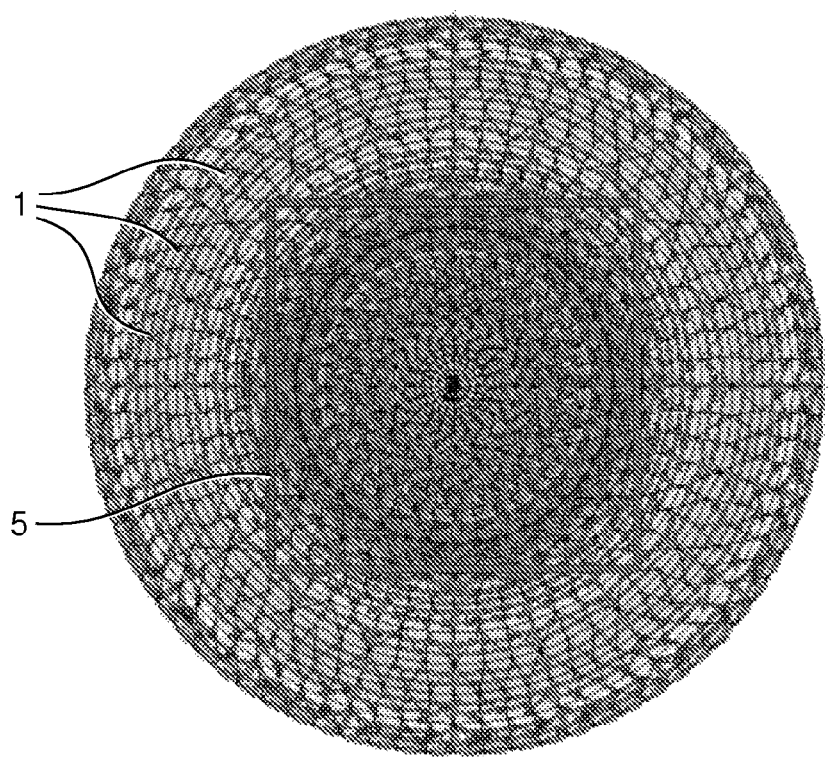
FIG. 21 shows a schematic view of a surface current density distribution on the antenna according to FIG. 17 on a circular bottom plate, with a loop excitation.

FIGS. 18 and 19 show different resonant current distributions on such a circular coil structure with a linear excitation by a line current 7, whereas in FIGS. 20 and 21 the rectangular conductor loop 5 for loop current excitation is indicated. FIGS. 18 and 20 relate to a patch array on a PEC ground plane, FIGS. 19 and 21 to a patch array on a circular bottom plate.

Again, preferred applications of these coils are surface transmit/receive coils with reduced local SAR and distributed surface current.

A coil structure according to the invention introduces new degrees of freedom to the coil designer for shaping the current distribution within the coil area and consequently the $B_1$-field above it. The design freedom originates in the choice of metal patch sizes and shapes, coupling capacitors, outer grounding capacitors (and possibly further grounding capacitors at inner edges).

A coil according to the invention can have a ring type resonant mode as required for the generation of a substantially vertical $B_1$-field. Enough degrees of design freedom are available to tune its resonance frequency to that of the lateral or diagonal modes and still have freedom to shape the current density pattern within the coil area.

It will be appreciated that features of the invention are susceptible to being combined in any combination without departing from the scope of the invention as defined by the accompanying claims.

While the invention has been illustrated and described in detail in the drawings and foregoing description, such illustration and description are to be considered illustrative or exemplary and not restrictive, and the invention is not limited to the disclosed embodiments. Variations to embodiments of the invention described in the foregoing are possible without departing from the scope of the invention as defined by the accompanying claims.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An RF coil for an MR imaging system comprising:
a metamaterial which transmits RF excitation signals and/or receives MR relaxation signals and operates in the RF/MR frequency band like a magnetic conductor or a magnetic wall, the metamaterial being a resonant periodic structure including one or more of wires and metal patches positioned on a metallic ground plane.

2. The RF coil according to claim 1, wherein the metamaterial includes an artificial magnetic conductor (AMC) material.

3. The RF coil according to claim 1, wherein the metallic ground plane includes:
a PEC screen.

4. The RF coil according to claim 1, further including:
a tuning assembly which tunes the metamaterial to excite orthogonal fundamental field nodes substantially at a frequency of the MR relaxation signals.

5. The RF coil according to claim 1, wherein patches are arranged in a ring sector shape.

6. The RF coil according to claim 1, further including a tuning assembly including at least one of patches of selectable size and capacitors of selectable value.

7. The RF coil according to claim 1, wherein the metamaterial forms a plane or a curved surface.

8. The RF coil according to claim 1, further including:
a dielectric substrate disposed on one side of the metamaterial, the ground plane being disposed on the other side of the dielectric substrate.

9. An RF coil for an MR imaging system comprising:
a material on a metallic ground plane which transmits RF excitation signals and/or receives MR relaxation signals in an RF/MR frequency band, the material including an array of metallic patches capacitively coupled with each other, to form a resonant surface on which surface currents can be resonantly excited and generate at least one field modus, and which operates as a tuned resonant structure in the RF/MR frequency band like a magnetic conductor or a magnetic wall.

10. The RF coil according to claim 9, wherein the patches are capacitively coupled with each other by switchable capacitors which control the RF/MR frequency band.

11. The RF coil according to claim 9, further including:
a conductor arranged above or below the patches, the conductor exciting resonant surface currents.

12. The RF coil according to claim 11, wherein the conductor includes at least one of a loop and a strip line.

13. The RF coil according to claim 9, wherein the patches are connected by posts to the ground plane.

14. An RF coil for a magnetic resonance imaging system, the RF coil comprising:
an array of metallic plates tuned to an RF/MR frequency band of the magnetic resonance imaging system;
a strip line running diagonally across the array of patches to excite the array of patches to transmit RF signals in the RF/MR frequency band.

15. An RF coil for an MR imaging system, for transmitting RF excitation signals and/or for receiving MR relaxation signals, in combination with or comprising a metamaterial which operates in the RF/MR frequency band like a magnetic conductor or a magnetic wall, which is tuned by selecting the sizes of the patches and/or the values of the coupling capacitors for exciting three orthogonal fundamental field modes at substantially the same resonant frequency.

16. An RF antenna for a MR imaging system comprising at least one RF coil according to claim 15.

17. An RF coil for a magnetic resonance (MR) system comprising:
a metamaterial structure which transmits RF excitation signals and/or MR relaxation signals substantially at a resonance frequency;
a tuning system which tunes the metamaterial structure to excite three orthogonal fundamental field modes substantially at the resonance frequency.

18. A magnetic resonance imaging system comprising:
at least one RF/MR coil or antenna according to claim 17 for transmitting RF excitation signals and/or for receiving MR relaxation signals.

19. The RF coil according to claim 17, wherein the tuning system includes at least one of:
patches of selectable size, and
coupling capacitors of selectable value.

* * * * *